US012744497B2

(12) United States Patent
Lind

(10) Patent No.: US 12,744,497 B2

(45) Date of Patent: *Sep. 22, 2026

(54) CLASS-D AMPLIFIER WITH NESTED FEEDBACK LOOPS

(71) Applicant: QSC, LLC, Costa Mesa, CA (US)

(72) Inventor: Anders Lind, San Juan Capistrano, CA (US)

(73) Assignee: QSC, LLC, Costa Mesa, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/454,730

(22) Filed: Aug. 23, 2023

(65) Prior Publication Data

US 2024/0088843 A1 Mar. 14, 2024

Related U.S. Application Data

(63) Continuation of application No. 17/406,026, filed on Aug. 18, 2021, now Pat. No. 11,784,615, which is a continuation of application No. 16/880,629, filed on May 21, 2020, now Pat. No. 11,128,270.

(51) Int. Cl.

*H03F 3/217* (2006.01)
*H03F 1/26* (2006.01)
*H03F 3/38* (2006.01)

(52) U.S. Cl.

CPC ....... *H03F 3/2171* (2013.01); *H03F 2200/03* (2013.01); *H03F 2200/156* (2013.01); *H03F 2200/267* (2013.01); *H03F 2200/351* (2013.01)

(58) Field of Classification Search

CPC ............... H03F 3/2171; H03F 2200/03; H03F 2200/156; H03F 2200/267; H03F 2200/351; H03F 3/2175; H03F 2200/171; H03F 3/45475; H03F 2200/135; H03F 2203/45526; H03F 3/183

USPC ....................................... 330/10, 251, 207 A

See application file for complete search history.

(56) References Cited

U.S. PATENT DOCUMENTS

| | | | | |
|---|---|---|---|---|
| 6,297,692 | B1 * | 10/2001 | Nielsen | H03F 1/083 330/10 |
| 7,084,799 | B1 | 8/2006 | Butler | |
| 7,541,869 | B2 | 6/2009 | Adduci et al. | |
| 9,660,586 | B2 | 5/2017 | Raimondi et al. | |
| 10,164,581 | B2 | 12/2018 | Andersen | |

(Continued)

FOREIGN PATENT DOCUMENTS

| | | |
|---|---|---|
| EP | 2983292 A1 | 2/2016 |
| EP | 2975763 B1 | 12/2019 |

(Continued)

OTHER PUBLICATIONS

International Searching Authority, International Search Report and Written Opinion, PCT Patent Application PCT/US2021/032579, mailed Aug. 9, 2021, 20 pages.

(Continued)

*Primary Examiner* — Hieu P Nguyen

(74) *Attorney, Agent, or Firm* — Perkins Coie LLP

(57) ABSTRACT

A class-D amplifier with multiple "nested" levels of feedback. The class-D amplifier surrounds an inner feedback loop, which takes the output of a switching amplifier and corrects for errors generated across the switching amplifier, with additional feedback loops that also take the output of the switching amplifier.

20 Claims, 5 Drawing Sheets

(56) References Cited

U.S. PATENT DOCUMENTS

| | | | |
|---|---|---|---|
| 11,128,270 | B1 | 9/2021 | Lind |
| 11,784,615 | B2 | 10/2023 | Lind |
| 2018/0138865 | A1 | 5/2018 | De Vries |

FOREIGN PATENT DOCUMENTS

| | | | |
|---|---|---|---|
| WO | 9819391 | A2 | 5/1998 |
| WO | 2019110154 | A1 | 6/2019 |

OTHER PUBLICATIONS

Nielsen, Karsten, "MECC—A Novel Control Method for High End Switching Audio Power Amplification," AES Journal of the Audio Engineering Society, No. 4839, Sep. 26, 1998, 25 pages.

European Examination Report, EP App. No. 21731343.6 mailed Jan. 13, 2026, 9 pages.

Indian Patent Office, First Examination Report for IN Appl. No. 202217073904, issued Oct. 13, 2025, 7 pages.

* cited by examiner

CLASS-D AMPLIFIER WITH NESTED FEEDBACK LOOPS

CROSS REFERENCE TO RELATED APPLICATIONS

This application is a continuation of U.S. patent application Ser. No. 17/406,026, filed Aug. 18, 2021, and titled CLASS-D AMPLIFIER WITH NESTED FEEDBACK LOOPS, which is a continuation of U.S. patent application Ser. No. 16/880,629, filed May 21, 2020, and titled CLASS-D AMPLIFIER WITH NESTED FEEDBACK LOOPS, both of which are incorporated herein by reference in their entirety.

TECHNICAL FIELD

The technology disclosed herein relates to audio amplifiers and in particular class-D audio amplifiers with improved performance.

BACKGROUND

Audio amplifiers receive input signals and generate output signals with increased power. For example, when the input signal is a time-varying signal such as an audio signal, the amplifier output signal (i.e., the amplified signal) will have a proportionally greater amplitude than the input signal. The gain of an amplifier describes the ratio between the magnitude of the output and input signals, and the amplifier's bandwidth is the range of frequencies amplified by the amplifier. One goal of an amplifier is to produce an output signal with an acceptable gain, over needed frequencies, without introducing unwanted distortions. Audio amplifiers, for example, are designed to reproduce input audio signals at their output, with desired power levels and with acceptable distortion, over typical audio frequency ranges (e.g., 20 Hz to 20 kHz).

Class-D amplifiers derive a pulse-width modulated (PWM) signal from an input signal and amplify the PWM signal using switching transistors. The amplified signal is then passed through a low-pass filter before generating the output signal. Class-D amplifiers may utilize feedback to reduce distortion and noise in the output signal. One of the challenges with such amplifiers is that even with the benefit of feedback, there are limits to the gain and bandwidth that can be achieved by a class-D amplifier before limitations arise. For example, for certain class-D amplifiers, there exists a limit on how much gain may be achieved before the amplifier suffers from stability issues. Accordingly, there is a need for an improved class-D amplifier design.

DETAILED DESCRIPTION

Figure 1:
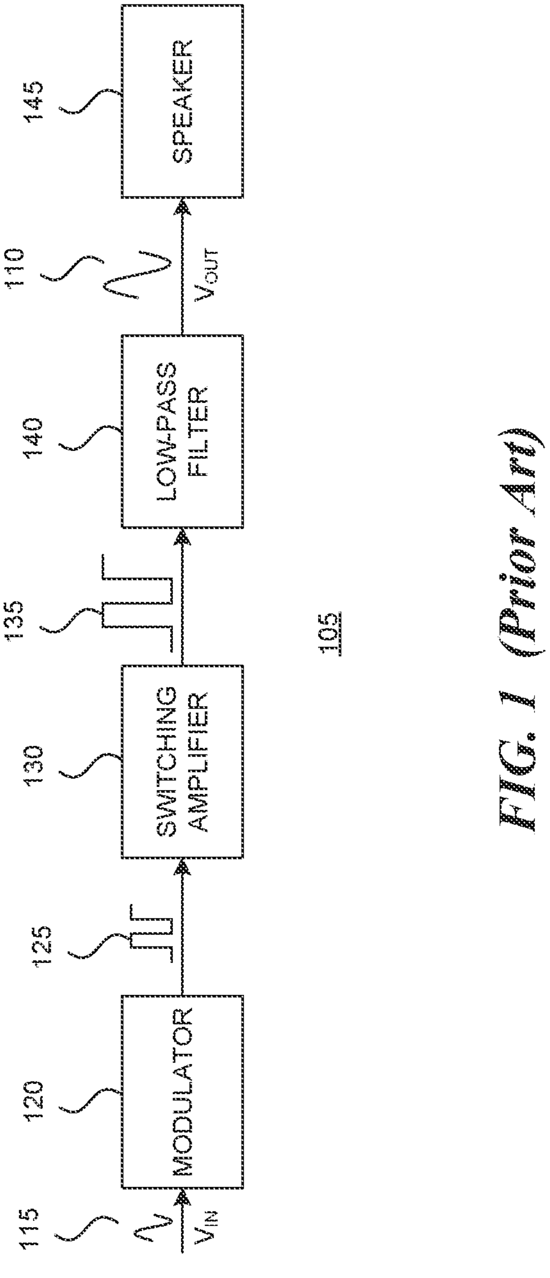
FIG. 1 is a simplified block diagram of a conventional class-D amplifier.

As will be discussed in further detail below, the technology disclosed herein relates to amplifiers and in particular to class-D amplifiers with nested feedback loops that improve amplifier performance.

Embodiments of the present technology provide an audio amplifier having, first and second summing nodes, a switch node, and a switching amplifier coupled between the switch node and the first summing node. A filter is coupled to the switch node, and the filter is between the switch mode and a speaker that receives the amplified output signal. A global feedback loop receives a signal portion from filter and provides the signal portion to a third summing node. A nested amplifier portion generates a pulse-width modulated signal driven on the first summing node, and the nested amplifier portion has a first feedback loop nested within second feedback loop. The first feedback loop has a first loop feedback module that provides a first feedback signal from the switch node to the first summing node. The second feedback loop provides a second feedback signal from the switch node to the second summing node. The second feedback loop has a second loop feedback module coupled between the switch node and the second summing node. A second loop integrator module is coupled to the second summing node. A second loop compensator module is coupled to the second loop integrator module and a compensator node, with the second loop integrator module between the second loop compensator module and the compensator node. A second loop forward compensator module is coupled between the second loop compensator module and the first summing node. The global feedback loop can have an outer loop feedback module between the filter and the third summing node, wherein the third summing node receives an amplifier input signal. An outer loop summing module is coupled to the third summing node, and an outer loop forward compensation module is coupled to the outer loop summing module node and the second summing node. The outer loop summing module is between the third summing node and the outer loop forward compensator module.

Another embodiment provides an audio amplifier having first and second summing nodes, a switch node, and a switching amplifier coupled between the switch node and the first summing node. A filter coupled to the switch node is between the switch mode and a speaker that receives the amplified output signal. A nested amplifier portion is configured to generate an amplified signal portion driven on the first summing node. The nested amplifier portion has a first feedback loop nested within second feedback loop. The first feedback loop has a first loop feedback module that provides a first feedback signal portion from the switch node to the first summing node. The second feedback loop provides a second feedback signal portion from the switch node to the second summing node. The second feedback loop has a second loop feedback module coupled between the switch node and the second summing node. A second loop integrator module is coupled to the second summing node. A second loop compensator module is coupled to the second loop integrator module and a compensator node, with the second loop integrator module between the second loop compensator module and the compensator node. A second loop forward compensator module is coupled between the second loop compensator module and the first summing node.

Another embodiment of the present technology provides a class-D amplifier that receives an audio input signal. The amplifier comprises a switching amplifier configured to drive an amplified signal to a switch node based on a pulse-width modulated signal received by the switching amplifier at a first summing node. An inductor/capacitor (LC) filter is coupled to the switch node and configured to generate an amplifier output signal from the amplified signal driven by the switching amplifier. A global feedback loop is coupled to the LC filter output, the input signal, and a global summing node. Nested feedback circuits are configured to generate the pulse-width modulated signal driven on the first summing node based on the input signal. The nested feedback circuits have a first feedback loop nested within second feedback loop. The first feedback loop has a first loop feedback module from the switch node to the first summing node. The second feedback loop has a second loop feedback module coupled to the switch node and a second summing node. A second loop integrator module is coupled to the second summing node and an integrator node. A second loop compensator module is coupled to the integrator node and a compensator node, and a second loop forward compensator module is coupled to the compensator node and the first summing node.

The second loop feedback module can includes a resistor, the second loop integrator module can includes a capacitor and an opamp, the second loop compensator module can includes a resistor, a capacitor, and an opamp. The switching amplifier can include two MOSFETs connected in series, wherein the pulse-width modulated signal is coupled to the gate of both MOSFETs. The amplifier output signal generated by the LC filter can drive a speaker. The amplifier of one or more embodiment can include a third feedback loop coupled to the switch node, the input signal, and the second summing node. The amplifier can have a triangle carrier signal coupled to the first summing node.

Referring now to the drawings, FIG. 1 is a simplified block diagram of a conventional class-D amplifier 105 that generates an amplified output signal 110 from an input signal 115. When the input signal and the output signal are audio signals, the amplifier 105 can be used to drive, for example, a powered speaker 145. Though not shown, the amplifier 105 can also be used to drive a rackmount power amplifier or other audio equipment.

In the illustrated example, both the input signal 115 and the amplified output signal 110 are analog signals. However, as described herein, in a class-D amplifier 105 the amplifying devices operate as electronic switches operating on received modulated pulses. The illustrated amplifier 105 therefore generates a modulated signal 125 from the input signal 115 using a modulator 120. The modulated signal can be a train of square pulses of fixed amplitude but varying width and separation, and represents the amplitude variations of the analog input signal. The modulated signal can be derived using pulse-width modulation (PWM), pulse density modulation, or other forms of modulation. For example, the modulator can be implemented as a comparator that compares a triangular carrier to the input signal, which generates a series of pulses in which the duty cycle is proportional with the instantaneous value of the input signal.

The modulated signal 125 drives a switching amplifier 130, which generates an amplified modulated signal 135. The frequency content of the amplified modulated signal 135 includes high-frequency content from the modulation process, as well as the content of the input signal 115. The class-D amplifier 105 therefore may include a low-pass filter 140 to filter out the high-frequency content prior to driving an output device, such as the powered speaker 145. The low-pass filter can be implemented, for example, using an inductor and a capacitor (i.e., an LC filter).

Class-D amplifiers may utilize various forms of feedback to provide error control, thereby reducing noise and distortion in the amplified output signal. For example, a class-D amplifier may use feedback from the input to the LC filter to correct for noise on the rail voltages supplying the switching amplifier. Similarly, a class-D amplifier may use feedback from the LC filter output to correct for noise introduced by the filter.

Figure 2:
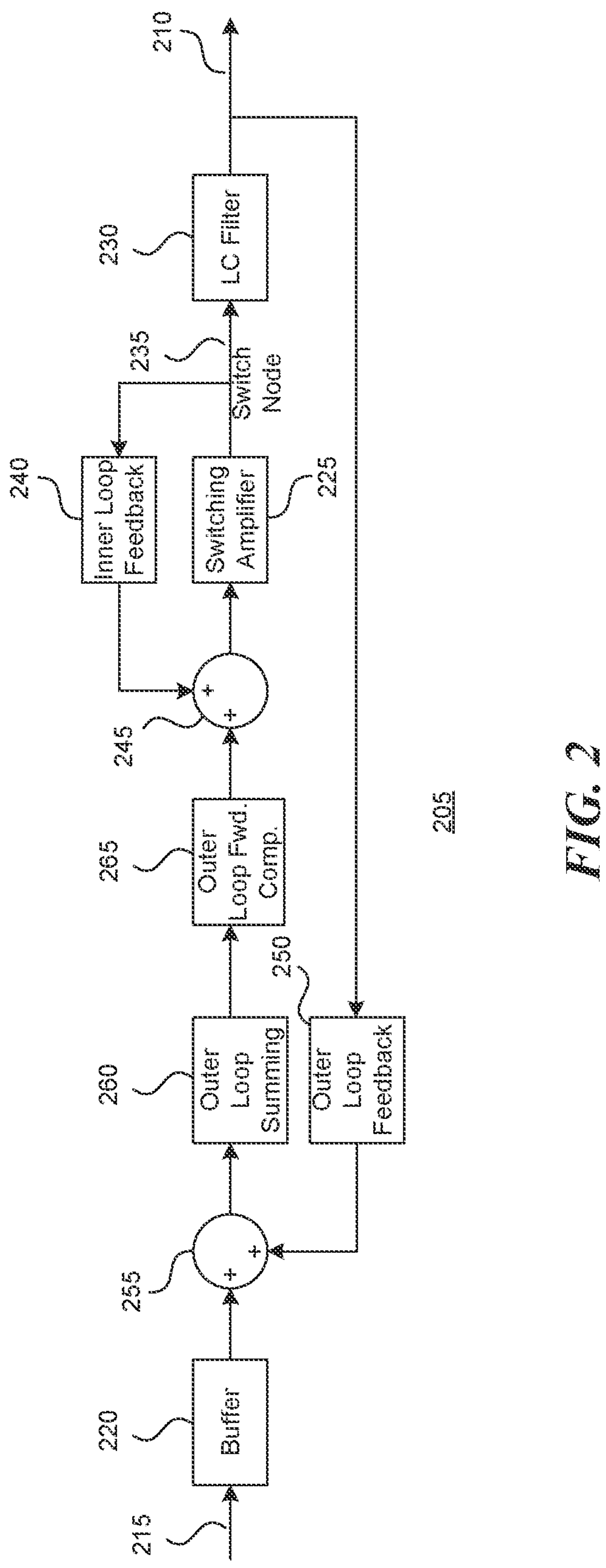
FIG. 2 is a component-level diagram of a class-D amplifier with feedback.

FIG. 2 illustrates the component-level diagram of a class-D amplifier 205 with feedback, constructed in accordance with an embodiment of the disclosed technology. The amplifier 205 generates an amplified output signal 210 from an input audio signal 215. The input audio signal 215 can be an analog audio signal. The amplifier 205 includes a buffer stage 220 for the input audio signal, which can be implemented for example using one or more resistors or other discrete elements. The amplifier 205 also includes a switching amplifier 225 and an inductor/capacitor (LC) filter 230. The switching amplifier 225 can be implemented using amplifying devices, for example MOSFET transistors, that operate as electronic switches. In some embodiments, the switching amplifier 205 can have two MOSFETs connected in series, and a pulse width modulated signal is coupled to the gate of the MOSFETs. The transistors switch back and forth between the positive and negative rail voltages supplying the transistors based on the modulated signal, thereby generating the amplified modulated signal in which the pulse amplitude is based on the switching transistor supply voltages. In other words, the amplification is achieved by virtue of the switching. The switching amplifier and LC filter operate as described above with respect to the switching amplifier 130 and low-pass filter 140 illustrated in FIG. 1. The amplifier 205 of FIG. 2 additionally includes two feedback loops, described below.

The amplifier 205 includes an inner loop feedback module 240 driven by the output of the switching amplifier 225, at a switch node 235, and drives a summing node 245 at the switching amplifier input. The feedback from the switching amplifier output (i.e., the switch node) to the switching amplifier input (i.e., the summing node) enables the amplifier 205, for example, to correct for errors introduced by the switching amplifier 225. The inner loop feedback module 240 can be implemented, for example, using one or more resistors or other discrete elements.

The amplifier 205 additionally includes an outer feedback module 250, which feeds the amplified output signal 210 of the amplifier 205 to an outer loop summing node 255, which is additionally driven by the buffer stage 220. The outer feedback module 250 can be implemented using, for example, one or more resistors, capacitors, or other discrete elements. The outer loop summing node 255 drives an outer loop summing module 260, which drives an outer loop forward compensation module 265; the outer loop summing module 260 and outer loop forward compensation module 265 collectively compensate for the outer feedback module 250. The outer loop summing module 260 can be implemented as an operational amplifier ("opamp") with summing error amp input, in which one or more resistors, capacitors, and other discrete elements drive the opamp output back to the negative input of the opamp. The outer loop forward compensation module 265, which drives the summing node 245 and ultimately the switching amplifier 225, can be implemented with one or more resistors, capacitors, or other discrete elements. The outer feedback, or global feedback, from the amplifier output enables the amplifier 205 to correct for errors introduced by the LC filter 230. Furthermore, the outer loop compensators enable further stability and error correction.

In class-D amplifiers, errors introduced between the input to the switching amplifier and the output from the switching amplifier (i.e., across the switching amplifier) commonly dominate the overall performance of the amplifier. That is, the switching amplifier may be the largest contributor to total harmonic distortion plus noise (THD+N) in the amplifier output. As a result, conventional class-D amplifier designs tend to focus on improvements to the error correction of the inner feedback loop (such as the inner loop feedback module 240 illustrated in FIG. 2). Inner feedback loop error correction may be improved, for example, by increasing the loop gain and bandwidth of the inner feedback loop as much as possible. There are however limitations on how much inner feedback loop gain can be achieved when considerations such as small-signal stability criterion, large-signal physical criterion, and time-domain related criterion are considered (e.g., Nyquist stability criterion due to the switching nature of the switching amplifier).

The amplifier 205 of the present technology provides additional feedback from the switching amplifier output to obtain further improved performance. For example, a second inner feedback loop can be used to take feedback from the switching amplifier output and close around the inner feedback loop described above (such as the inner feedback described in FIG. 2). The additional second inner feedback loop, as well as the inner feedback loop nested within it (i.e., the first inner feedback loop), can be combined with other components to produce an effective power stage (e.g., gain and phase) that behaves similar to a single inner feedback loop. Furthermore, the two inner feedback loops can produce an effective total error correction much greater (which respect to errors introduced across the switching amplifier) than a single inner feedback loop. That is, the "nesting" of inner feedback loops provides greater performance than a class-D amplifier with only a single inner feedback loop.

Figure 3:
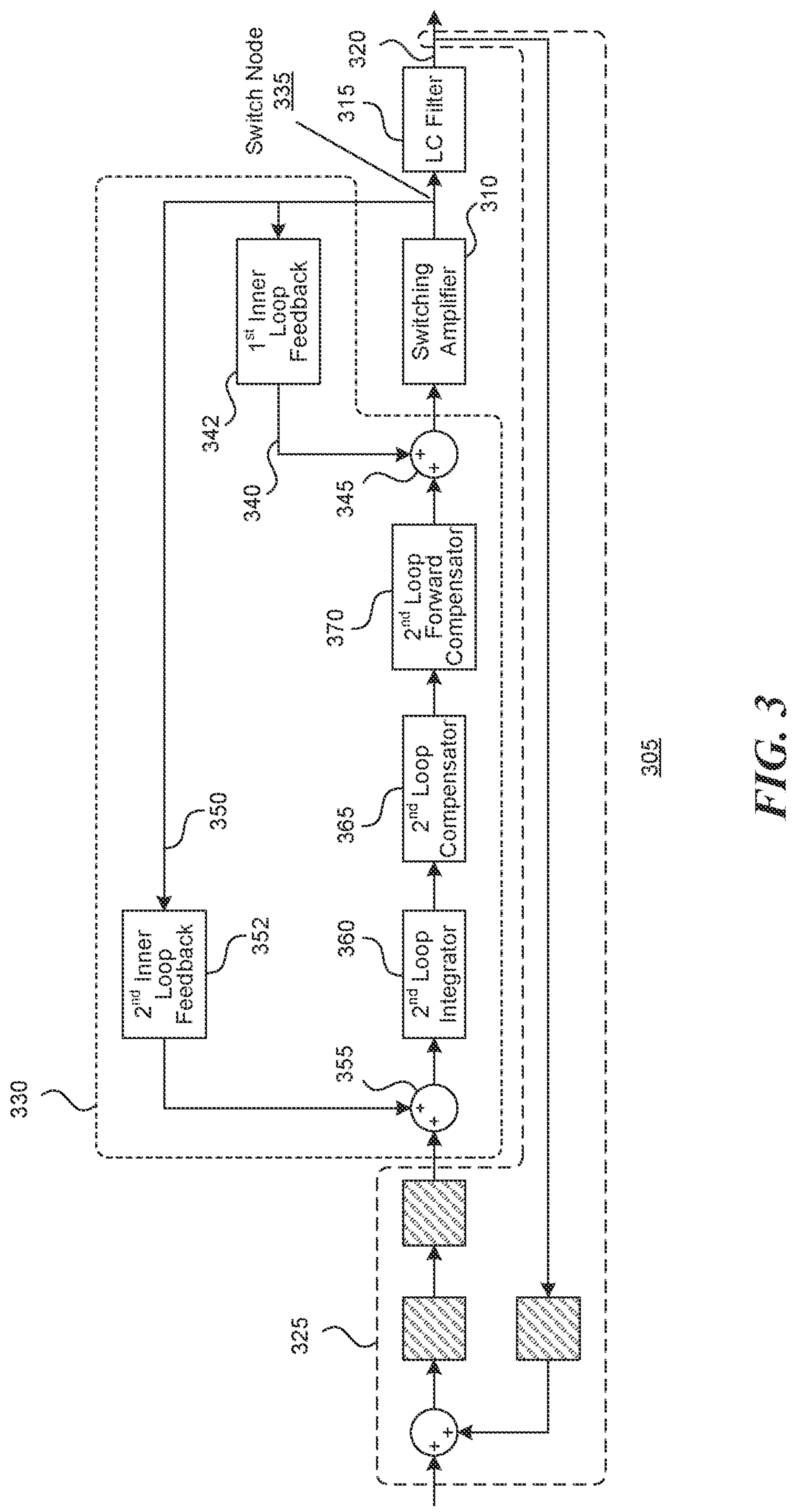
FIG. 3 is a component-level diagram of a class-D amplifier with nested feedback in accordance with one embodiment of the disclosed technology.

FIG. 3 illustrates the component-level diagram of a class-D amplifier 305 with the nested feedback, constructed in accordance with embodiments of the disclosed technology. The amplifier 305 shares certain similarities with the amplifier illustrated in FIG. 2, including a switching amplifier 310 to generate an amplified signal, and an LC filter 315 to eliminate high-frequency content from the amplified signal before driving an amplifier output 320. The amplifier 305 can also utilize outer feedback and compensation 325 from the amplifier output. As illustrated in FIG. 3, the amplifier 305 also utilizes nested feedback 330 from the switch node 335 driven by the switching amplifier 310.

The nested feedback 330 includes a first inner feedback loop 340, which includes a first inner loop feedback module 342. The first inner loop feedback module 342 is driven by the output of the switching amplifier 310 at the switch node 335, and drives a first summing node 345 at the switching amplifier input. The first inner loop feedback module 342 can be implemented, for example, using one or more resistors or other discrete elements.

The nested feedback 330 also includes a second inner feedback loop, which includes a second inner loop feedback module 352. The second inner loop feedback module 352, which can be implemented using one or more resistors or other discrete elements, is driven by the output of the switching amplifier 310 at the switch node 335. However, unlike the first inner loop feedback module 342, the second inner loop feedback module 352 drives a different node, such as a second summing node 355. The second summing node 355 is additionally driven by the outer feedback and compensation 325, and is ultimately coupled (via a second loop integrator module 360, a second loop compensator module 365, and a second loop forward compensator module 370, described further below) to the first summing node 345 of the first inner feedback loop. Accordingly, the second inner feedback loop 350 of the nested feedback surrounds the first inner feedback loop 340.

As described above, the second summing node 355 drives the second loop integrator module 360, which then drives the second loop compensator module 365. The second loop integrator module 360 and the second loop compensator module 365 combine to provide compensation for the second inner feedback loop 350. The second loop integrator module 360 can be implemented as an opamp with negative feedback, with a capacitor or other discrete element on the negative opamp feedback path. The second loop compensator module 365 can be implemented as an opamp with negative feedback, with a capacitor and resistor (e.g., in parallel with one another) on the negative opamp feedback path. The second loop compensator module 365 drives the second loop forward compensator module 370, which can be implemented by one or more resistors or other discrete elements. The second loop forward compensator module 365 drives the first summing node 345 of the first inner feedback loop 340, thereby completing the nesting of the second inner feedback loop 350 around the first inner feedback loop 340.

Figure 4:
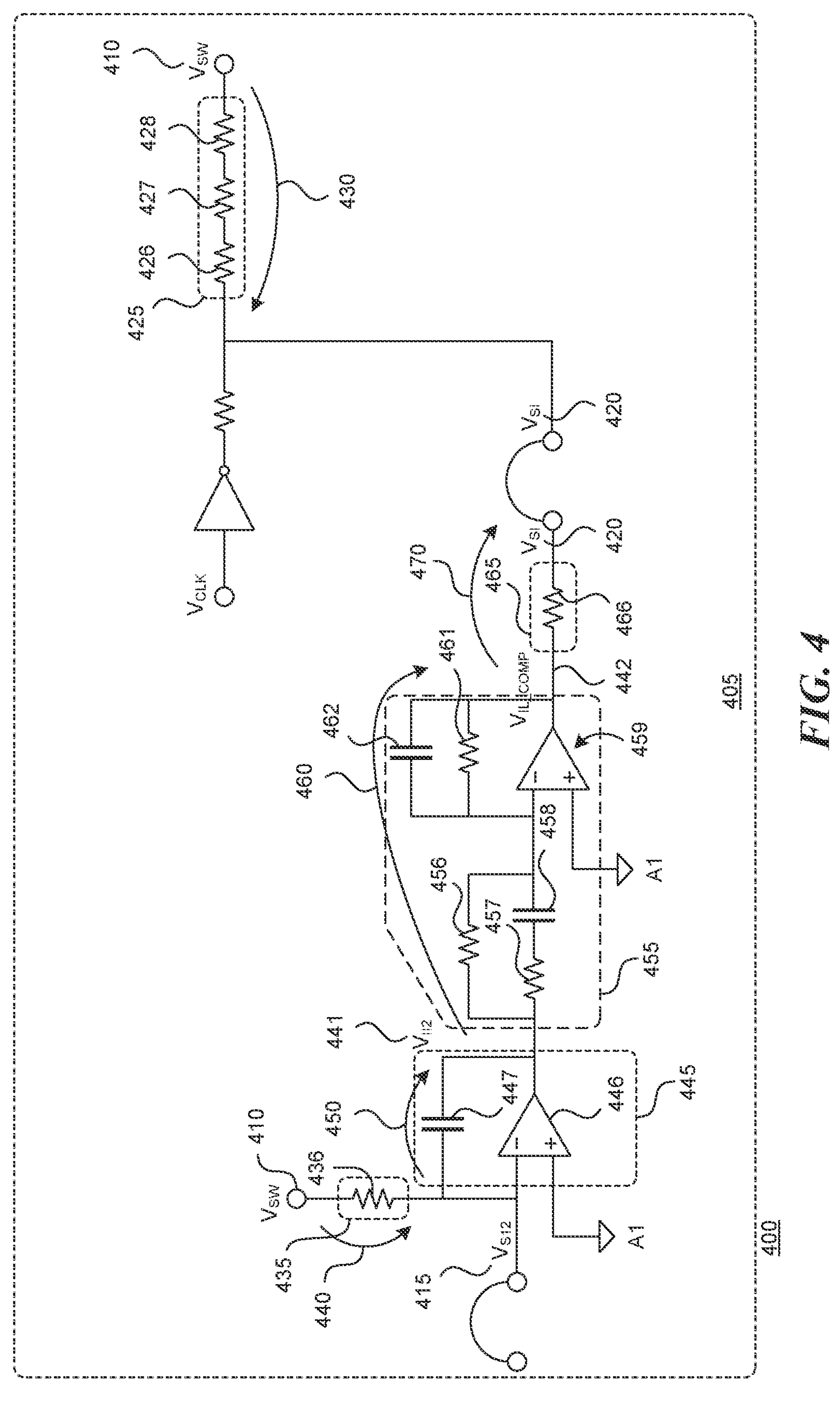
FIG. 4 is a schematic diagram of a nested feedback circuit for a class-D amplifier in accordance with one embodiment of the disclosed technology.

FIG. 4 illustrates the schematic diagram of a nested feedback circuit 405 for a class-D amplifier 400, constructed in accordance with an embodiment of the disclosed technology. The illustrated nested feedback circuit 405 represents a portion, and not the entirety, of the amplifier 400. That is, the illustrated circuit has inputs and outputs internal to the overall amplifier 400. For example, the circuit 405 receives input signal $V_{SW}$ 410, corresponding to a switching amplifier output, or switch node, of the amplifier 400. The circuit 405 additionally receives input $V_{SI2}$ 415, corresponding to a compensator output of a global feedback loop of the amplifier 400, the circuit 405 outputs a signal $V_{SI}$ 420, which drives a switching amplifier input of the amplifier 400. As described below, the circuit elements illustrated in FIG. 4 are identified by various transfer functions that characterize the change in signal across those elements; transfer functions are denoted with an arrow in the figure. The transfer functions may correspond to class-D amplifier components or modules described herein (e.g., in connections with FIGS. 2, 3, and 5).

Circuit elements 425 are coupled between signal $V_{SW}$ 410 (a switching amplifier output) and signal $V_{SI}$ 420 (the switching amplifier input), and implement a first inner loop feedback transfer function 430. In the illustrated embodiment, the circuit elements include a resistor 426, a resistor 427, and a resistor 428 connected in series.

Circuit elements 435 are coupled between signal $V_{SW}$ 410 (a switching amplifier output) and $V_{SI2}$ 415, and implement a second inner loop feedback transfer function 440. In the illustrated embodiment, the circuit elements include a resistor 436.

Circuit elements 445 are coupled between $V_{SI2}$ 415 and a signal $V_{II2}$ 441, and implement a second inner loop integrator transfer function 450. In the illustrated embodiment, the circuit elements include an opamp 446, with a capacitor 447 connected to the opamp output and the opamp negative input.

Circuit elements 455 are coupled between $V_{II2}$ 441 and a signal $V_{IL\_COMP}$ 442, and implement a second inner loop compensator transfer function 460. In the illustrated embodiment, the circuit elements include a resistor 456, in parallel with a resistor 457 and capacitor 458, that drive the negative input of an opamp 459 from $V_{II2}$. The circuit elements also include a resistor 461 and capacitor 462, in parallel with one another and connected between the opamp output ($V_{IL\_COMP}$) and the negative input of the opamp.

Circuit elements 465 are coupled between $V_{IL\_COMP}$ 442 and signal $V_{SI}$ 420 (i.e., the output of nested feedback circuit 405), and implement a second inner loop forward compensator transfer function 470. In the illustrated embodiment, the circuit elements include a resistor 466.

Though FIG. 4 illustrates an example of a schematic diagram of a nested feedback circuit constructed in accordance with an embodiment of the disclosed technology, other circuits can be used. For example, circuit elements illustrated as being directly connected to one another in FIG. 4 may instead be coupled to one other, such as operatively, electrically, or other, with other circuit elements connected directly in between.

Figure 5:
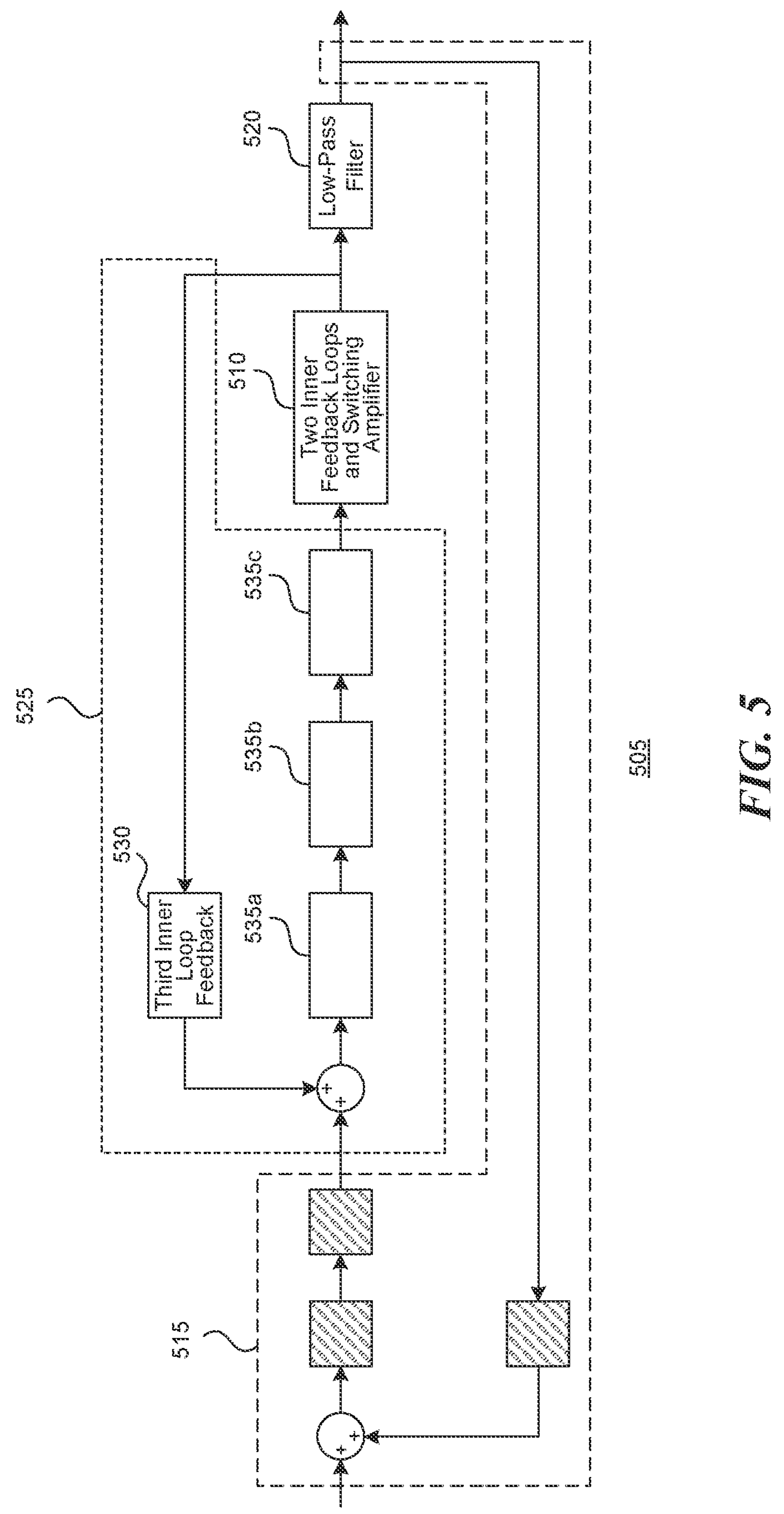
FIG. 5 is a component-level diagram of a class-D amplifier with additional nested feedback in accordance with one embodiment of the disclosed technology.

While FIGS. 3 and 4 illustrate examples of class-D amplifiers with two levels of nested feedback (i.e., a first inner feedback loop and a second inner feedback loop), additional nesting may be utilized. FIG. 5 is a component-level diagram of a class-D amplifier 505 with three levels of nested feedback, constructed in accordance with an embodiment of the disclosed technology. The class-D amplifier shares certain similarities with the amplifier illustrated in FIG. 3 (with two-levels of nested feedback), including two levels of nested feedback surrounding a switching amplifier 510, outer feedback and compensation 515, and a low-pass filter 520. The class-D amplifier additionally includes a third inner feedback loop 525, with third inner loop feedback module 530 and third inner loop compensation modules 535*a*, 535*b*, and 535*c*.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. An audio amplifier that generates an amplified output signal, comprising:

first and second summing nodes;

a switch node;

a switching amplifier coupled between the switch node and the first summing node;

a filter coupled to the switch node, with the filter between the switch node and a speaker that receives the amplified output signal;

a global feedback loop configured to receive a signal portion from the filter and provide the signal portion to a third summing node; and a nested amplifier portion configured to generate a modulated signal driven on the first summing node, the nested amplifier portion comprising a first feedback loop nested within the second feedback loop, wherein:

the first feedback loop comprises:

a first loop feedback module that provides a first feedback signal from the switch node to the first summing node; and the second feedback loop that provides a second feedback signal from the switch node to the second summing node, the second feedback loop comprises:

a second loop feedback module coupled between the switch node and the second summing node;

a second loop integrator module coupled to the second summing node;

a second loop compensator module coupled to the second loop integrator module and a compensator node, with the second loop integrator module between the second loop compensator module and the compensator node; and a second loop forward compensator module coupled between the second loop compensator module and the first summing node.

2. The amplifier of claim 1 wherein the global feedback loop comprises:

an outer loop feedback module between the filter and the third summing node, wherein the third summing node receives an amplifier input signal;

an outer loop summing module coupled to the third summing node; and an outer loop forward compensation module coupled to the outer loop summing module node and the second summing node, wherein the outer loop summing module is between the third summing node and the outer loop forward compensator module.

3. The amplifier of claim 1 wherein the second loop integrator module includes a capacitor and an opamp.

4. The amplifier of claim 1 wherein the second loop compensator module includes a resistor, a capacitor, and an opamp.

5. The amplifier of claim 1 wherein the switching amplifier includes two MOSFETs connected in series, wherein the modulated signal is coupled to the gate of both MOSFETs.

6. The amplifier of claim 1 wherein the filter is an inductor/capacitor (LC) filter.

7. The amplifier of claim 1 further comprising a triangle carrier signal coupled to the first summing node.

8. An audio amplifier, comprising:

first and second summing nodes;

a switch node;

a switching amplifier coupled to the switch node and the first summing node;

a filter coupled to the switch node, with the filter between the switch node and a speaker that receives the amplified output signal;

a nested amplifier portion configured to generate an amplified signal portion driven on the first summing node, the nested amplifier portion comprising a first feedback loop nested within second feedback loop, wherein:

the first feedback loop comprises:

a first loop feedback module that provides a first feedback signal portion from the switch node to the first summing node; and the second feedback loop that provides a second feedback signal portion from the switch node to the second summing node, the second feedback loop comprises:

a second loop feedback module coupled between the switch node and the second summing node;

a second loop integrator module coupled to the second summing node;

a second loop compensator module coupled to the second loop integrator module and a compensator node, with the second loop integrator module between the second loop compensator module and the compensator node; and a second loop forward compensator module coupled between the second loop compensator module and the first summing node.

9. The amplifier of claim 8, further comprising a global feedback loop configured to receive an output signal portion from the filter and provide the output signal portion to a third summing node, the global feedback loop comprising:

an outer loop feedback module between the filter and the third summing node, wherein the third summing node receives an amplifier input signal;

an outer loop summing module coupled to the third summing node; and an outer loop forward compensation module coupled to the outer loop summing module node and the second summing node, wherein the outer loop summing module is between the third summing node and the outer loop forward compensator module.

10. A class-D amplifier that receives an audio input signal, the amplifier comprising:

a switching amplifier configured to drive an amplified signal to a switch node based on a modulated signal received by the switching amplifier at a first summing node;

an inductor/capacitor (LC) filter coupled to the switch node and configured to generate an amplifier output signal from the amplified signal driven by the switching amplifier;

a global feedback loop coupled to the LC filter output, the input signal, and a global summing node; and nested feedback circuits configured to generate the modulated signal driven on the first summing node, based on the input signal, the nested feedback circuits comprising a first feedback loop nested within a second feedback loop, wherein:

the first feedback loop comprises:

a first loop feedback module from the switch node to the first summing node; and the second feedback loop comprises:

a second loop feedback module coupled to the switch node and a second summing node;

a second loop integrator module coupled to the second summing node and an integrator node;

a second loop compensator module coupled to the integrator node and a compensator node; and a second loop forward compensator module coupled to the compensator node and the first summing node.

11. The class-D amplifier of claim 10 wherein the global feedback loop comprises:

an outer loop feedback module coupled between the LC filter output and the global summing node, wherein the global summing node is configured to receive the audio input signal;

an outer loop summing module coupled to the global summing node; and an outer loop forward compensation module coupled to the outer loop summing node and the second summing node, wherein the outer loop summing module is between the global summing node and the outer loop forward compensator module.

12. The class-D amplifier of claim 10 wherein the second loop feedback module includes a resistor.

13. The class-D amplifier of claim 10 wherein the second loop integrator module includes a capacitor and an opamp.

14. The class-D amplifier of claim 10 wherein the second loop compensator module includes a resistor, a capacitor, and an opamp.

15. The class-D amplifier of claim 10 wherein the second loop forward compensator module includes a resistor.

16. The class-D amplifier of claim 10 wherein the switching amplifier includes two MOSFETs connected in series, wherein the modulated signal is coupled to the gate of both MOSFETs.

17. The class-D amplifier of claim 10 wherein the input signal is an analog audio signal.

18. The class-D amplifier of claim 10 wherein the class-D amplifier output signal generated by the LC filter drives a speaker.

19. The class-D amplifier of claim 10 further comprising a third feedback loop coupled to the switch node, the input signal, and the second summing node.

20. The class-D amplifier of claim 10 further comprising a triangle carrier signal coupled to the first summing node.

* * * * *